(12) United States Patent
Wong et al.

(10) Patent No.: US 7,968,991 B2
(45) Date of Patent: Jun. 28, 2011

(54) STACKED PACKAGE MODULE AND BOARD HAVING EXPOSED ENDS

(75) Inventors: Lin-Yin Wong, Hsinchu (TW);
Mao-Hua Yeh, Hsinchu (TW);
Wang-Hsiang Tsai, Hsinchu (TW)

(73) Assignee: Unimicron Technology Corp. (TW)

( * ) Notice: Subject to any disclaimer, the term of this patent is extended or adjusted under 35 U.S.C. 154(b) by 300 days.

(21) Appl. No.: 11/976,488

(22) Filed: Oct. 25, 2007

(65) Prior Publication Data

US 2008/0246135 A1 Oct. 9, 2008

(30) Foreign Application Priority Data

Apr. 4, 2007 (TW) ................................. 96112007 A (51) Int. Cl.
*H01L 23/02* (2006.01)
*H01L 23/48* (2006.01)
*H01L 23/52* (2006.01)
*H01L 29/40* (2006.01)
*H05K 7/00* (2006.01)
*H05K 1/18* (2006.01)

(52) U.S. Cl. ........ 257/686; 257/777; 257/692; 257/693; 257/773; 361/735; 361/761; 361/790

(58) Field of Classification Search .................. 257/686, 257/777, 692, 693, 773; 361/735, 790, 761
See application file for complete search history.

(56) References Cited

U.S. PATENT DOCUMENTS

| | | | |
|---|---|---|---|
| 6,370,013 B1 * | 4/2002 | Iino et al. | 361/306.3 |
| 6,380,615 B1 * | 4/2002 | Park et al. | 257/686 |
| 6,472,734 B2 * | 10/2002 | Arakawa et al. | 257/686 |
| 6,862,189 B2 * | 3/2005 | Higuchi | 361/767 |
| 6,906,407 B2 * | 6/2005 | Byers et al. | 257/686 |
| 7,057,277 B2 * | 6/2006 | Chen et al. | 257/707 |
| 7,230,332 B2 * | 6/2007 | Hsu | 257/700 |
| 7,242,591 B2 * | 7/2007 | Imamura et al. | 361/761 |
| 7,649,748 B2 * | 1/2010 | Kariya et al. | 361/782 |
| 2005/0133932 A1 * | 6/2005 | Pohl et al. | 257/777 |
| 2005/0157477 A1 * | 7/2005 | Kuramochi et al. | 361/761 |
| 2005/0211465 A1 * | 9/2005 | Sunohara et al. | 174/260 |
| 2006/0087020 A1 * | 4/2006 | Hirano et al. | 257/686 |
| 2006/0131729 A1 * | 6/2006 | Lee | 257/700 |
| 2006/0163723 A1 * | 7/2006 | Hsu | 257/737 |
| 2007/0126102 A1 * | 6/2007 | Mohammed et al. | 257/686 |
| 2007/0228543 A1 * | 10/2007 | Walter et al. | 257/686 |
| 2007/0278644 A1 * | 12/2007 | Hsu et al. | 257/686 |
| 2007/0287230 A1 * | 12/2007 | Kuramochi et al. | 438/128 |
| 2008/0047740 A1 * | 2/2008 | Lien et al. | 174/256 |
| 2008/0117608 A1 * | 5/2008 | Seo et al. | 361/761 |
| 2008/0197472 A1 * | 8/2008 | Matsushiima | 257/686 |

* cited by examiner

*Primary Examiner* — Teresa M Arroyo
(74) *Attorney, Agent, or Firm* — Bacon & Thomas, PLLC (57) ABSTRACT

A stacked package module is disclosed, which comprises: a first package structure comprising a first circuit board with a first chip embedded therein, wherein the first chip has a plurality of electrode pads; the first circuit board comprises a first surface, an opposite second surface, a plurality of exposed electro-connecting ends, a plurality of first conductive pads on the first surface, a plurality of conductive vias, and at least one circuit layer, therewith the electrode pads of the first chip electrically connecting to the electro-connecting ends and the first conductive pads directly through the conductive vias and the circuit layer; and a second package structure electrically connecting to the first package structure through a plurality of first solder balls to make a package on package. The stacked package module of this invention has characters of compact size, high performance, high flexibility, and detachability.

16 Claims, 6 Drawing Sheets

STACKED PACKAGE MODULE AND BOARD HAVING EXPOSED ENDS

BACKGROUND OF THE INVENTION

1. Field of the Invention

The present invention relates to a stacked package module and, more particularly, to a stacked package module which can enhance the elasticity of conductive pad layout and the electro-connecting region.

2. Description of Related Art

In the development of electronics, the design trend of electronic devices is towards multifunction and high-performance. Thus, high-density integration and miniaturization are necessary for a semiconductor package structure. On the ground of reason aforementioned, the mono-layered circuit boards providing electrical connections among active components, passive components, and circuits, are being replaced by the multi-layered circuit boards. The area of circuit layout on the circuit board increases in a restricted space by interlayer connection to meet the requirement of high-density integrated circuits.

In general, a conventional semiconductor package structure is made such that a semiconductor chip is mounted by its back surface on the top surface of the substrate, then the package structure is finished through wire bonding, or a semiconductor chip is mounted by the active surface thereof on the top surface of the substrate, thereby finishing a flip-chip package structure, followed by placing solder balls on the back surface of the substrate to provide electrical connections for an electronic device like a printed circuit board.

FIG. 1 shows a conventional wire bonding package structure. The wire bonding package structure 1 comprises a circuit board 10, a chip 11, a plurality of metal wires 14, and a molding material 15. The circuit board 10 has a first surface 10*a* having a plurality of wire bonding pads 101 and an opposite second surface 10*b* having a plurality of solder pads 102. In addition, the circuit board 10 has a cavity 105, and the chip 11 is disposed in the cavity 105. The active surface 11*a* of the chip 11 has a plurality of electrode pads 111, electrically connecting to the wire bonding pads 101 of the circuit board 10 by the metal wires 14. The cavity 105 of the circuit board 10 is filled with the molding material 15, and the molding material 15 wraps the chip 11 and the metal wires 14. The solder pads 102 of the circuit board 10 can electrically connect with an electronic device (not shown) by solder balls 16.

FIG. 2 shows a stacked package module comprising the aforementioned package structure. The stacked package module is accomplished by stacking two same package structures 1 and 1' as shown in FIG. 1. The solder pads 102' on the surface 10*b*' of the upper package structure 1' electrically connect with the conductive pads 103 on the surface 10*a* of the lower package structure 1 by a plurality of solder balls 203.

However, in the above module comprising a plurality of stacked package structures, only the remaining region of the substrate of each package structure, where no semiconductor chip is disposed, can suffice conductive pads for electrically connecting with another package structure by solder balls. It is indicated that the electrical connecting area on the substrate of each package structure is limited, and thereby the number and the layout of I/O connections of each package structure is limited, resulting in reduced elasticity of circuit layout on the substrate and design flexibility of the package structure.

In addition, soldering is the only method for electrically connecting the aforementioned package structure with an electronic device, resulting in nondetachable electrical connections.

Accordingly, the purpose of the present invention is to provide a package structure having characteristics of compact size, high performance, high flexibility, and detachability.

SUMMARY OF THE INVENTION

The object of the present invention is to provide a stacked package module where a package structure with a chip embedded therein functions as a package unit, which can provide a more compact size and space-saving product. In addition, the ball grid array area of the package structure with a chip embedded therein is not limited by the chip area so as to provide a more elastic conductive pad layout, and the exposed electro-connecting ends of the stacked package module can further provide detachable electrical connections for the stacked package module with an electronic device. Furthermore, the utilization of a package on package (POP) method can connect different package structures by solder balls and conductive pads to provide a package module having the function of system integration for various products. The package structure with a chip embedded therein can further electrically connect to at least one passive component to meet the requirements for electrical characteristics.

To achieve the above object, the present invention provides a stacked package module, comprising: a first package structure comprising a first circuit board with a first chip embedded therein, wherein the first chip has a plurality of electrode pads, the first circuit board comprises a first surface, an opposite second surface, a plurality of exposed electro-connecting ends to provide detachable electro-connections with an electronic device, a plurality of first conductive pads on the first surface, a plurality of conductive vias, and at least one circuit layer, therewith the electrode pads of the first chip electrically connecting to the electro-connecting ends and the first conductive pads directly through the conductive vias and the circuit layer; and a second package structure comprising a second chip and a second circuit board, wherein the second circuit board has a first surface, an opposite second surface, and a plurality of second conductive pads on the second surface, therewith the second conductive pads of the second package structure electrically connecting to the first conductive pads of the first package structure through a plurality of first solder balls to accomplish a package module having the function of system integration.

In the stacked package module of the present invention, the first circuit board of the first package structure has a core board with a through cavity therein, therewith the first chip embedded in the cavity of the core board, and the gap between the core board and the first chip filled with a filling material to fix the first chip. The first chip has an active surface and an opposite inactive surface, and the active surface has a plurality of electrode pads thereon. The electro-connecting ends extend from the core board. The first circuit board can further comprise a first built-up structure and a second built-up structure corresponding to and disposed on two sides of the core board, respectively. The first conductive pads are disposed on the surface of the first built-up structure. The first and second built-up structures individually comprise at least one dielectric layer, at least one circuit layer, a plurality of conductive vias, and a solder mask having a plurality of openings to expose the first conductive pads. Some of the conductive vias electrically connect to the electrode pads of the first chip. In order to protect the exposed electro-connecting ends from the oxidation and corrosion damage caused by environment, a passivation layer can be further formed on the surfaces of the electro-connecting ends, and the passivation layer can be a gold layer.

The second built-up structure of the first circuit board can further comprise a plurality of second conductive pads, and the solder mask of the second built-up structure has a plurality of openings to expose the second conductive pads. Accordingly, the second conductive pads can electrically connect to at least one passive component through a plurality of second solder balls to make the product meet the requirements for electrical characteristics.

In the stacked package module of the present invention, the first package structure connects to the second package structure through a plurality of first solder balls by package on package. The second package structure can be any type of package structure. Preferably, the second package structure is the same as the first package structure, flip chip package structure, wire bonding package structure, and so on.

Accordingly, the present invention provides a stacked package module wherein a package structure with a chip embedded therein functions as a package unit, which can provide a more compact size and space-saving product. In addition, the characteristics of the first circuit board electrically connecting to the first chip through the conductive vias can be employed in utilization of a chip with a more reduced pitch between electrode pads; since the circuit layout in the chip area of the first circuit board can be performed by the built-up structures, the ball grid array area of the package structure with a chip embedded therein is not limited by the chip area so as to provide a more elastic conductive pad layout. The exposed electro-connecting ends can further provide detachable electro-connections for the stacked package module with an electronic device. Furthermore, the utilization of the package on package (POP) method can connect different package structures to provide a package module having the function of system integration for various products, and the package structure with a chip embedded therein can further electrically connect to at least one passive component to make the product meet the requirements for electrical characteristics.

Other objects, advantages, and novel features of the invention will become more apparent from the following detailed description when taken in conjunction with the accompanying drawings.

DETAILED DESCRIPTION OF THE PREFERRED EMBODIMENT

Embodiment 1

Figure 1:
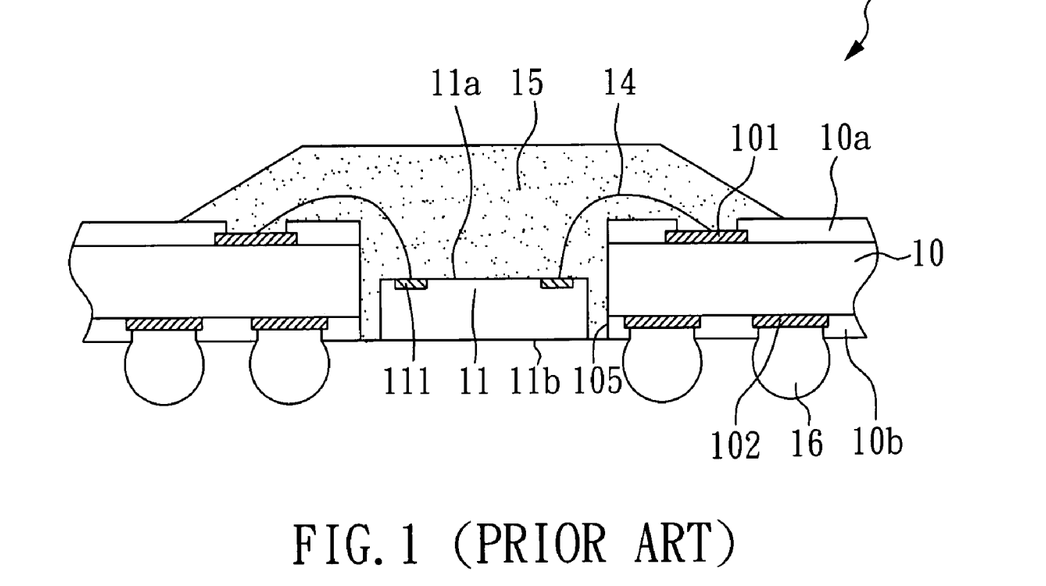
FIG. 1 is a cross-section view of a conventional package structure.
Figure 2:
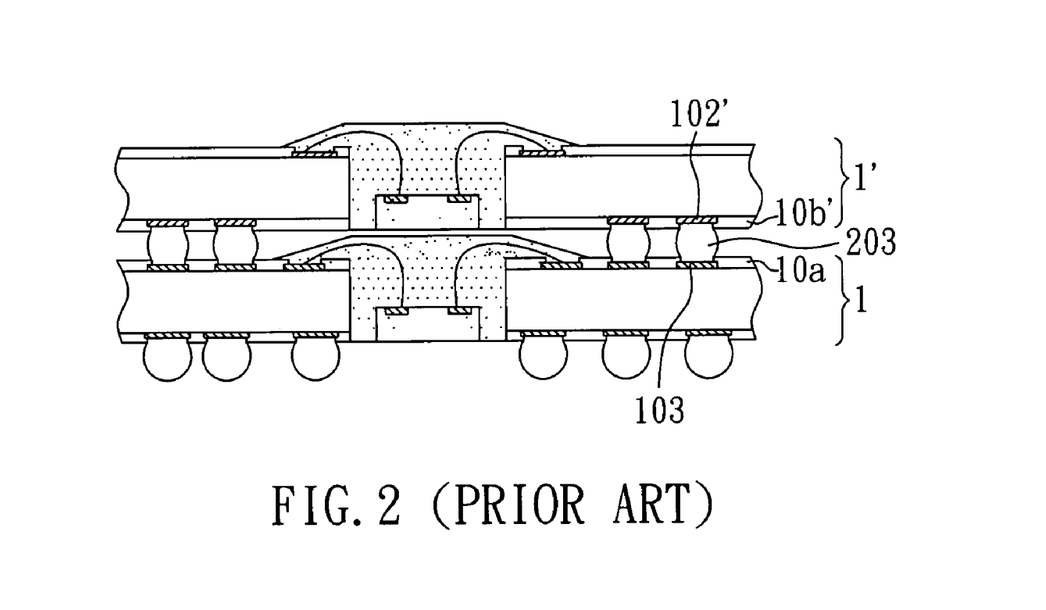
FIG. 2 is a cross-section view of a stacked package module comprising a conventional package structure.
Figure 3:
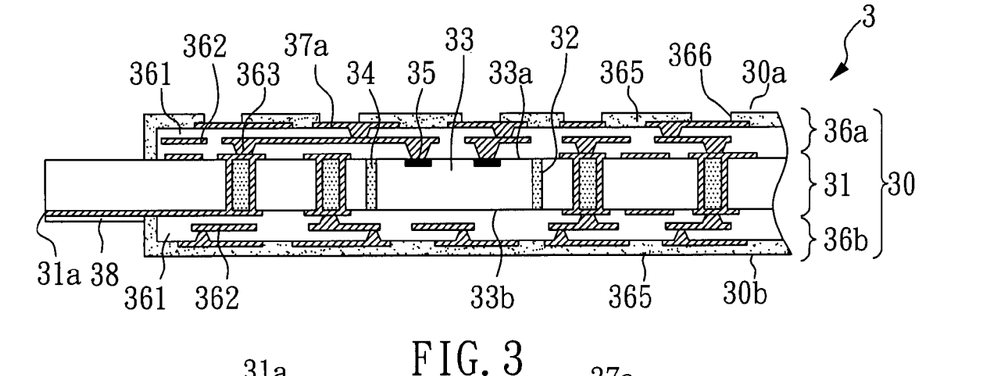
FIG. 3 is a cross-section view of a package structure with a chip embedded therein of a preferred embodiment of the present invention.
Figure 4:
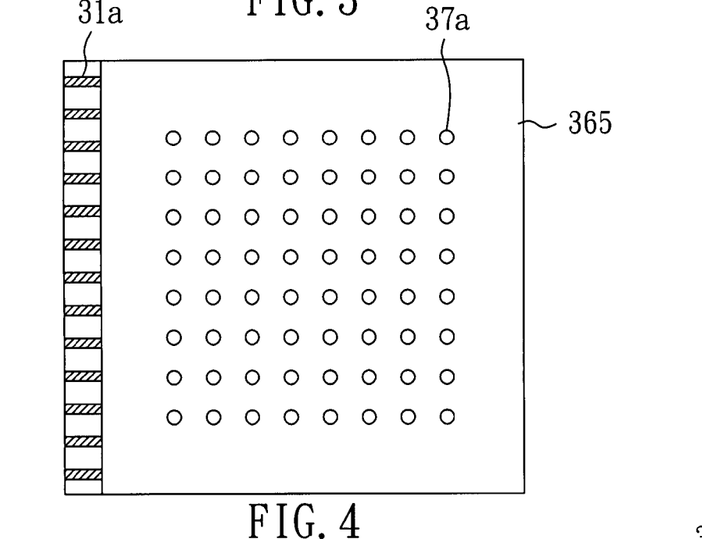
FIG. 4 is a top view of a package structure with a chip embedded therein of a preferred embodiment of the present invention.

With reference to FIG. 3, there is shown a cross-section view of a package structure with a chip embedded therein. The package structure 3 with a chip embedded therein of the present embodiment comprises a first circuit board 30 with a first chip 33 embedded therein. The first circuit board 30 has a first surface 30a, an opposite second surface 30b, a plurality of exposed electro-connecting ends 31a, and a plurality of first conductive pads 37a on the first surface 30a. In detail, the first circuit board 30 has a core board 31 with a through cavity 32 therein, therewith the first chip 33 embedded in the cavity 32 of the core board 31, the gap between the core board 31 and the first chip 33 filled with a filling material 34 to fix the first chip 33, the first chip 33 having an active surface 33a and an opposite inactive surface 33b, wherein the active surface 33a has a plurality of electrode pads 35. The first circuit board 30 further comprises a first built-up structure 36a and a second built-up structure 36b corresponding to and disposed on two sides of the core board 31, respectively, wherein the first conductive pads 37a are disposed on the surface of the first built-up structure 36a, and the first built-up structure 36a as well as the second built-up structure 36b comprises at least one dielectric layer 361, at least one circuit layer 362, a plurality of conductive vias 363, and a solder mask 365 having a plurality of openings 366 to expose the first conductive pads 37a as well as 37b, therewith some of the conductive vias 363 electrically connecting to the electrode pads 35 of the first chip 33, and at least one of the electrode pads 35 of the first chip 33 electrically connecting to one of the electro-connecting ends 31a and one of the first conductive pads 37a directly through the conductive vias 363 and the circuit layers 362. The electro-connecting ends 31a can provide detachable electro-connections for the stacked package structure 3 with an electronic device. In order to protect the exposed electro-connecting ends 31a from oxidation and corrosion damage caused by environment or otherwise, a gold layer as a passivation layer 38 can be further formed on the surfaces of the electro-connecting ends to form golden fingers. In addition, the first conductive pads 37a are arranged in a ball grid array, as shown in FIG. 4, which is a top view of the package structure 3 with a chip embedded therein of the present embodiment.

The filling material 34 is selected from the group consisting of organic dielectric material, liquid organic resin, and prepreg. In the present embodiment, the filling material 34 is prepreg to fix the first chip 33 in the cavity 32 of the core board 31. In addition, the materials of the first conductive pads 37a in the present embodiment are individually selected from the group consisting of copper, silver, gold, nickel/gold, nickel/palladium/gold, and the combination thereof.

Embodiment 2

Figure 5:
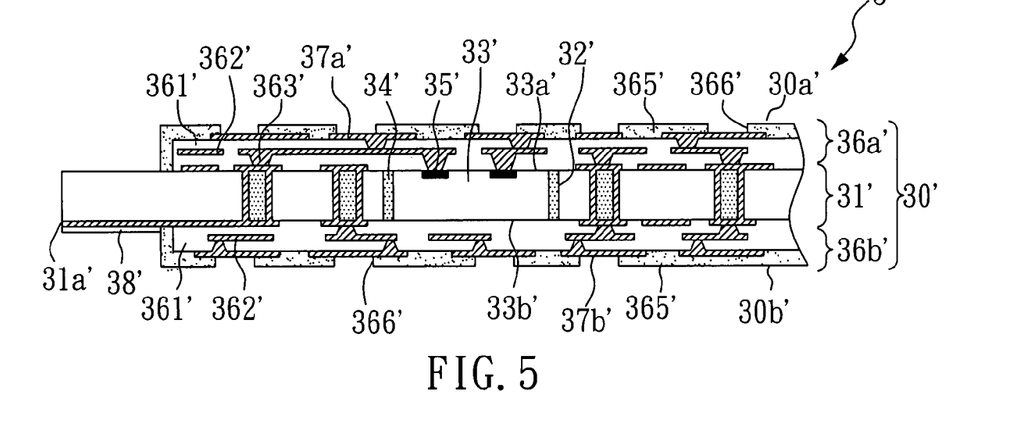
FIG. 5 is a cross-section view of a package structure with a chip embedded therein of a preferred embodiment of the present invention.

With reference to FIG. 5, there is shown a cross-section view of a package structure with a chip embedded therein.

The package structure 3' with a chip embedded therein of the present embodiment is the same as the package structure 3 of Embodiment 1, except that the package structure 3' further comprises a plurality of second conductive pads 37b', and the solder mask 365' of the second built-up structure 36b' has a plurality of openings 366' to expose the second conductive pads 37b'.

Embodiment 3

Figure 6:
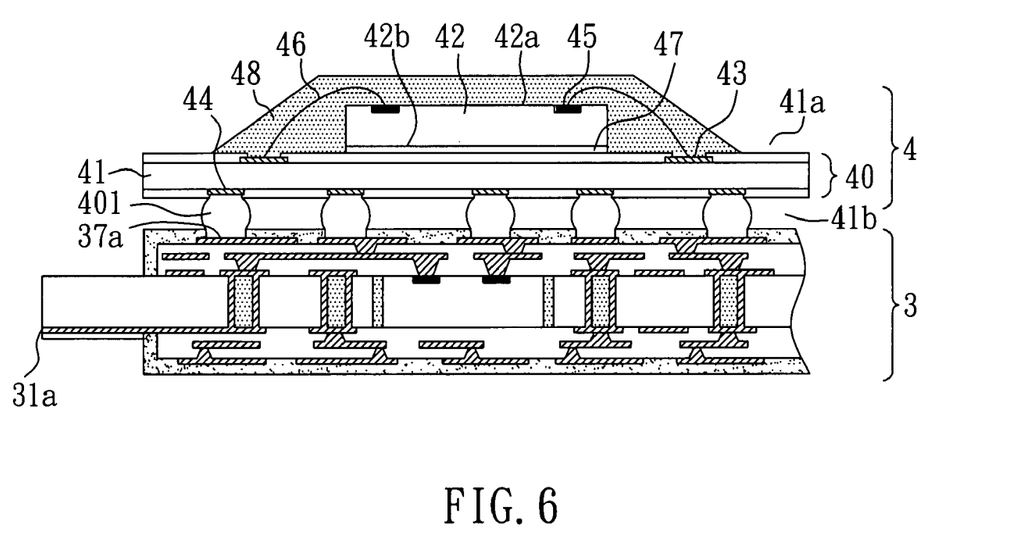
FIG. 6 is a cross-section view of a stacked package module of a preferred embodiment of the present invention.

With reference to FIG. 6, there is shown a cross-section view of a stacked package module. The stacked package module of the present embodiment uses the package structure 3 of Embodiment 1 and a wire bonding package structure 4 as package units. The wire bonding package structure 4 comprises a second chip 42 and a second circuit board 40. In detail, the second circuit board 40 comprises: a substrate 41 having a first surface (for adhering a chip) 41a and an opposite second surface (for adhering solder balls) 41b; a plurality of wire bonding pads 43 disposed on the first surface 41a; and a plurality of second conductive pads 44 disposed on the second surface 41b. The second chip 42 has an active surface 42a having a plurality of electrode pads 45 thereon and an inactive surface 42b. The electrode pads 45 of the second chip 42 electrically connect to the wire bonding pads 43 on the first surface 41a of the substrate 41 through a plurality of metal wires 46. The inactive surface 42b of the second chip 42 is fixed on the first surface 41a of the substrate 41 by an adhesive material 47. In addition, the wire bonding package structure 4 further comprises a molding material 48 to wrap the second chip 42 and the metal wires 46. In the stacked package module of the present embodiment, the package structure 3 connects to the package structure 4 through a plurality of first solder balls 401 by the package on package method. The second conductive pads 44 of the package structure 4 electrically connect to the first conductive pads 37a of the package structure 3 by the first solder balls 401.

Embodiment 4

Figure 7:
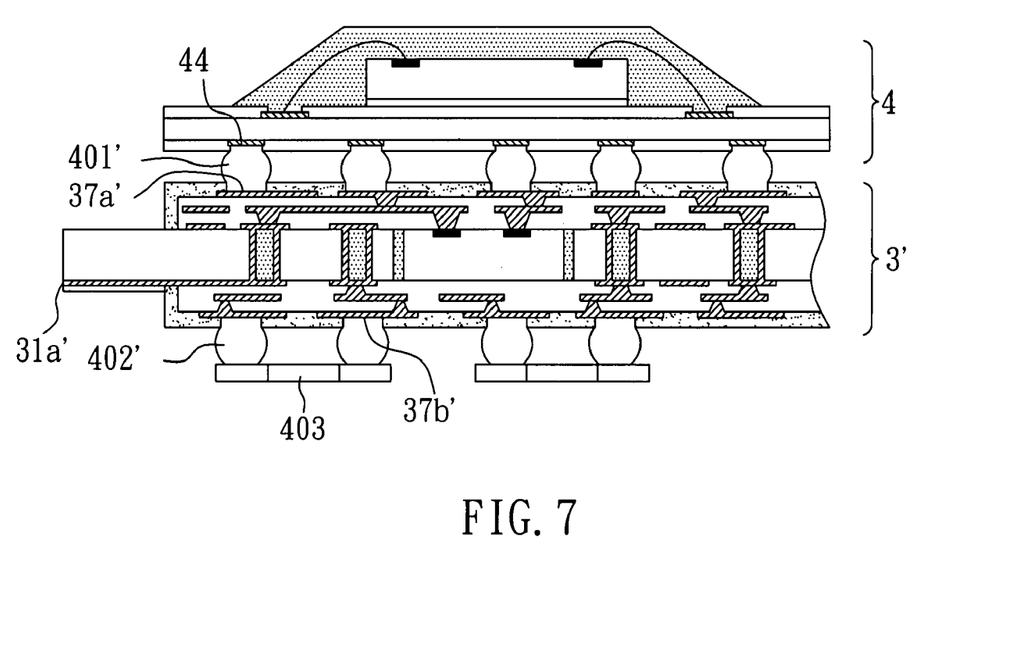
FIG. 7 is a cross-section view of a stacked package module of a preferred embodiment of the present invention.

With reference to FIG. 7, there is shown a cross-section view of a stacked package module. The stacked package module of the present embodiment uses the package structure 3' of Embodiment 2 and a wire bonding package structure 4 as package units. The wire bonding package structure 4 of the present embodiment is the same as that of Embodiment 3. In the stacked package module of the present embodiment, the package structure 3' connects to the package structure 4 through a plurality of first solder balls 401' by the package on package method. The second conductive pads 44 of the package structure 4 electrically connect to the first conductive pads 37a' of the package structure 3' by the first solder balls 401'. In addition, the second conductive pads 37b' of the package structure 3' electrically connect to a plurality of passive components 403 through a plurality of second solder balls 402'.

Embodiment 5

Figure 8:
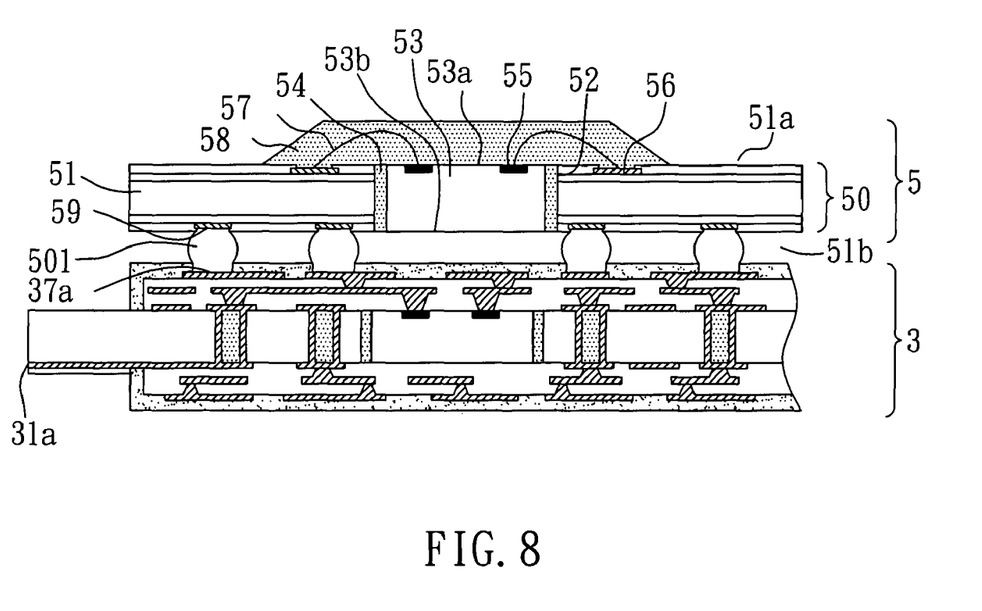
FIG. 8 is a cross-section view of a stacked package module of a preferred embodiment of the present invention.

With reference to FIG. 8, there is shown a cross-section view of a stacked package module. The stacked package module of the present embodiment uses the package structure 3 of Embodiment 1 and a wire bonding package structure 5 with a chip embedded therein as package units. The package structure 5 comprises a second chip 53 and a second circuit board 50. In detail, the second circuit board 50 comprises: a substrate 51 having a through cavity 52 therein, therewith the second chip 53 embedded in the through cavity 52, the gap between the cavity 52 in the substrate 51 and the second chip 53 filled with a filling material 54 to fix the second chip 53; a plurality of wire bonding pads 56 disposed on the first surface 51a of the second circuit board 50; and a plurality of second conductive pads 59 disposed on the second surface 51b of the second circuit board 50. The second chip 53 has an active surface 53a and an inactive surface 53b; the active surface 53a has a plurality of electrode pads 55 thereon and is at the same side with the first surface 51a of the second circuit board 50. The electrode pads 55 of the second chip 53 electrically connect to the wire bonding pads 56 through a plurality of metal wires 57. In addition, the package structure 5 further comprises a molding material 58 to wrap the metal wires 57, the electrode pads 55 of the second chip 53 and the wire bonding pads 56 of the second circuit board 50. In the stacked package module of the present embodiment, the package structure 3 connects to the package structure 5 through a plurality of first solder balls 501 by the package on package method. The second conductive pads 59 of the package structure 5 electrically connect to the first conductive pads 37a of the package structure 3 by the first solder balls 501.

Embodiment 6

Figure 9:
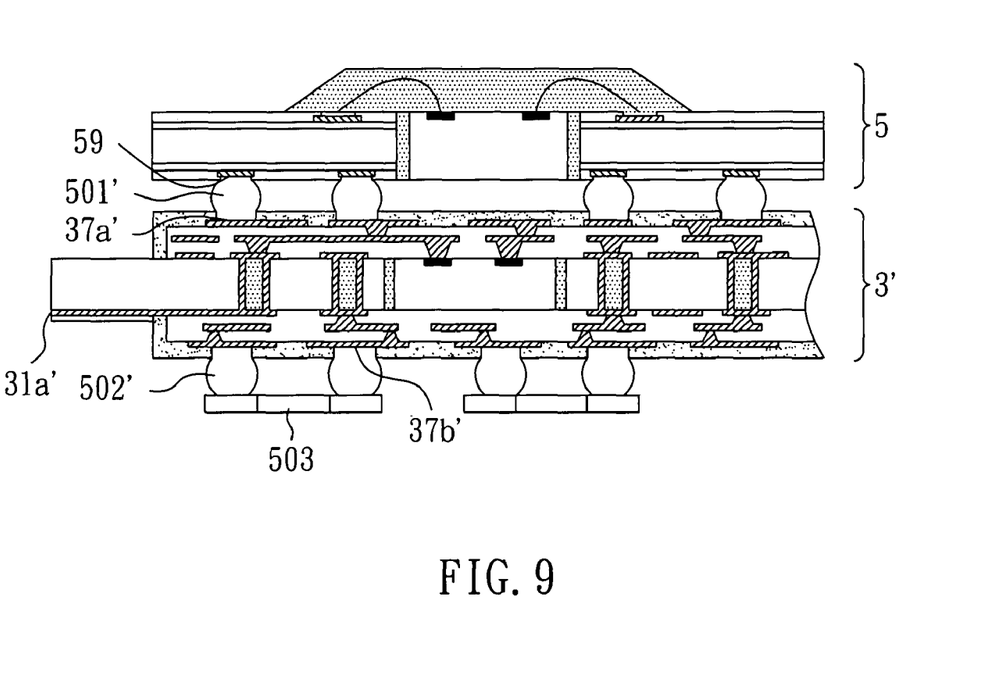
FIG. 9 is a cross-section view of a stacked package module of a preferred embodiment of the present invention.

With reference to FIG. 9, there is shown a cross-section view of a stacked package module. The stacked package module of the present embodiment uses the package structure 3' of Embodiment 2 and a wire bonding package structure 5 with a chip embedded therein as package units. The wire bonding package structure 5 with a chip embedded therein of the present embodiment is the same as that of Embodiment 5. In the stacked package module of the present embodiment, the package structure 3' connects to the package structure 5 through a plurality of first solder balls 501' by the package on package method. The second conductive pads 59 of the package structure 5 electrically connect to the first conductive pads 37a' of the package structure 3' by the first solder balls 501'. In addition, the second conductive pads 37b' of the package structure 3' electrically connect to a plurality of passive components 503 through a plurality of second solder balls 502'.

Embodiment 7

Figure 10:
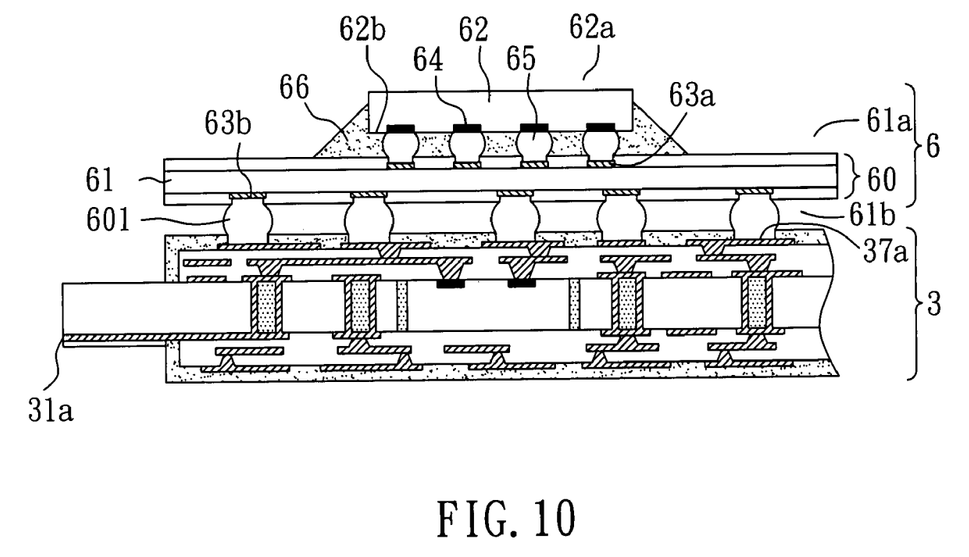
FIG. 10 is a cross-section view of a stacked package module of a preferred embodiment of the present invention.

With reference to FIG. 10, there is shown a cross-section view of a stacked package module. The stacked package module of the present embodiment uses the package structure 3 of Embodiment 1 and a flip chip package structure 6 as package units. The package structure 6 comprises a second chip 62 and a second circuit board 60. The second circuit board 60 comprises: a substrate 61 having a first surface (for adhering a chip) 61a and an opposite second surface (for adhering solder balls) 61b; a plurality of first conductive pads 63a disposed on the first surface 61a of the substrate 61; and a plurality of second conductive pads 63b disposed on the second surface 61b of the substrate 61. The second chip 62 has an active surface 62b having a plurality of electrode pads 64 thereon and an inactive surface 62a. The electrode pads 64 of the second chip 62 electrically connect to the first conductive pads 63a through a plurality of solder bumps 65. In addition, the package structure 6 further comprises an underfilling material 66 disposed between the second chip 62 and the substrate 61. In the stacked package module of the present embodiment, the package structure 3 connects to the package structure 6 through a plurality of first solder balls 601 by the package on package method. The second conductive pads 63b of the package structure 6 electrically connect to the first conductive pads 37a of the package structure 3 by the first solder balls 601.

Embodiment 8

Figure 11:
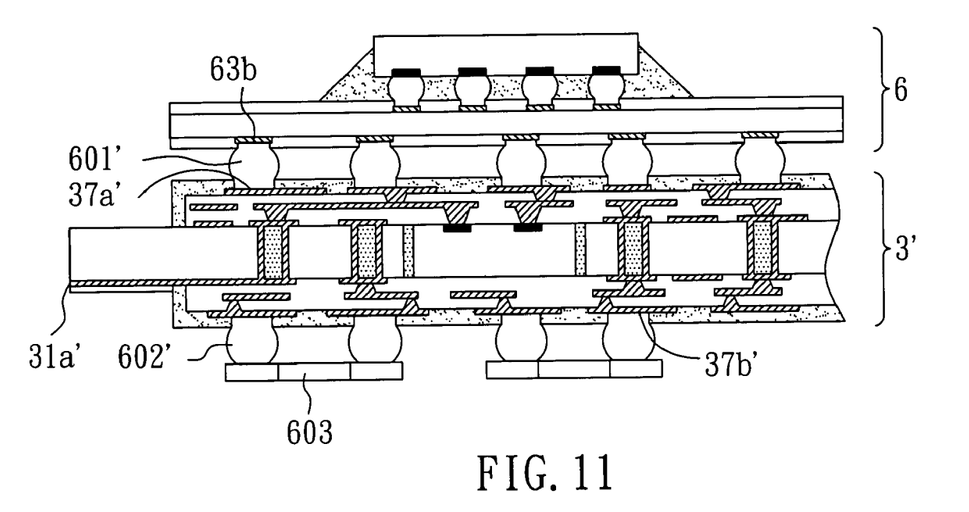
FIG. 11 is a cross-section view of a stacked package module of a preferred embodiment of the present invention.

With reference to FIG. 11, there is shown a cross-section view of a stacked package module. The stacked package module of the present embodiment uses the package structure 3' of Embodiment 2 and a flip chip package structure 6 as package units. The flip chip package structure 6 of the present embodiment is the same as that of Embodiment 7. In the stacked package module of the present embodiment, the package structure 3' connects to the package structure 6 through a plurality of first solder balls 601' by the package on package method. The second conductive pads 63b of the package structure 6 electrically connect to the first conductive pads 37a' of the package structure 3' by the first solder balls 601'. In addition, the second conductive pads 37b' of the package structure 3' electrically connect to a plurality of passive components 603 through a plurality of second solder balls 602'.

Embodiment 9

Figure 12:
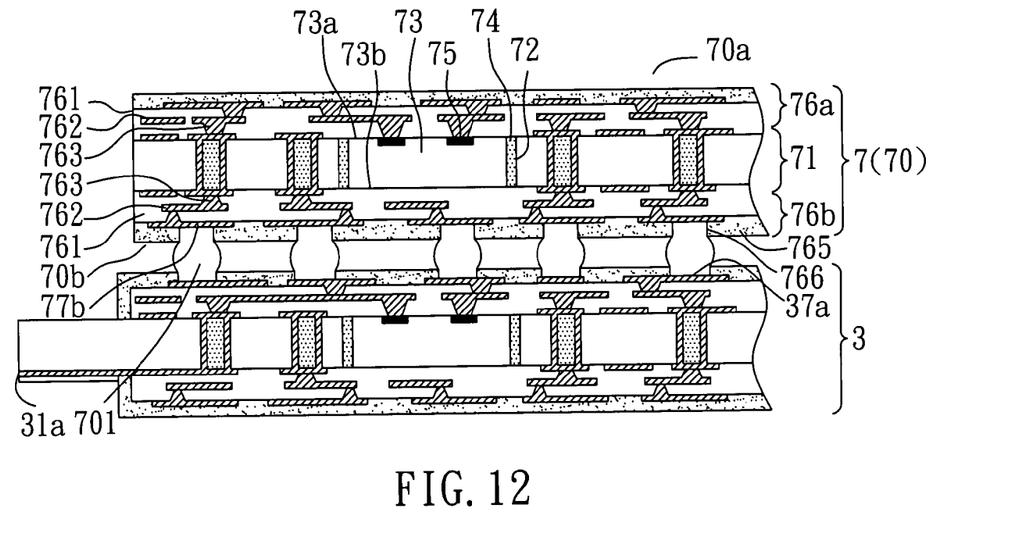
FIG. 12 is a cross-section view of a stacked package module of a preferred embodiment of the present invention.

With reference to FIG. 12, there is shown a cross-section view of a stacked package module. The stacked package module of the present embodiment uses the package structure 3 of Embodiment 1 and a package structure 7 with a chip embedded therein as package units. The package structure 7 comprises a second circuit board 70 with a second chip 73 embedded therein. In detail, the second circuit board 70 has a core board 71 with a through cavity 72 therein, therewith the second chip 73 embedded in the cavity 72 of the core board 71, the gap between the core board 71 and the second chip 73 filled with a filling material 74 to fix the second chip 73, wherein the second chip 73 has an active surface 73a having a plurality of electrode pads 75 thereon and an opposite inactive surface 73b. The second circuit board 70 further has a first built-up structure 76a and a second built-up structure 76b corresponding to and disposed on two sides of the core board 71, wherein a plurality of second conductive pads 77b are disposed on the surface of the second built-up structure 76b, and the first built-up structure 76a as well as the second built-up structure 76b comprises at least one dielectric layer 761, at least one circuit layer 762, a plurality of conductive vias 763, and a solder mask 765 having a plurality of openings 766 to expose the second conductive pads 77b, therewith some of the conductive vias 763 electrically connecting to the electrode pads 75 of the second chip 73. In the stacked package module of the present embodiment, the package structure 3 connects to the package structure 7 through a plurality of first solder balls 701 by the package on package method. The second conductive pads 77b of the package structure 7 electrically connect to the first conductive pads 37a of the package structure 3 by the first solder balls 701.

Embodiment 10

Figure 13:
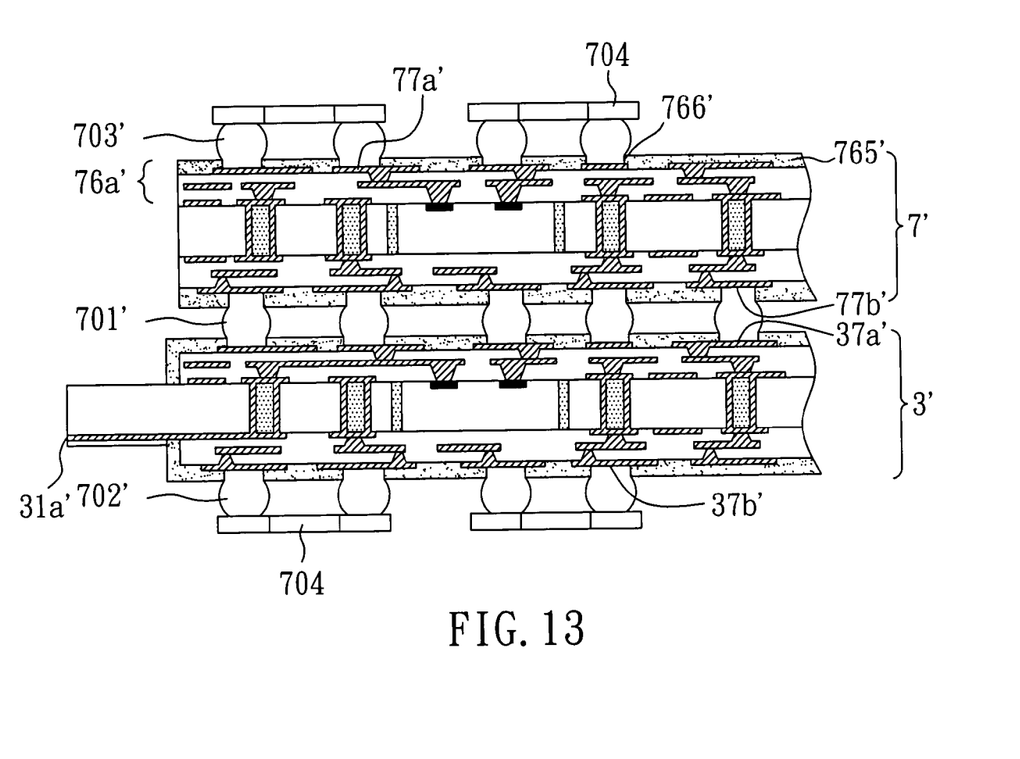
FIG. 13 is a cross-section view of a stacked package module of a preferred embodiment of the present invention.

With reference to FIG. 13, there is shown a cross-section view of a stacked package module. The stacked package module of the present embodiment uses the package structure 3' of Embodiment 2 and a package structure 7' with a chip embedded therein as package units. The package structure 7' is the same as the package structure 7, except that the package structure 7' further comprises a plurality of first conductive pads 77a', and the solder mask 765' of the first built-up structure 76a' has a plurality of openings 766' to expose the first conductive pads 77a'. In the stacked package module of the present embodiment, the package structure 3' connects to the package structure 7' through a plurality of first solder balls 701' by the package on package method. The second conductive pads 77b' of the package structure 7' electrically connect to the first conductive pads 37a' of the package structure 3' by the first solder balls 701'. In addition, the second conductive pads 37b' of the package structure 3' and the first conductive pads 77a' of the package structure 7' electrically connect to a plurality of passive components 704 through a plurality of second solder balls 702' and a plurality of third solder balls 703', respectively.

Although the present invention has been explained in relation to its preferred embodiment, it is to be understood that many other possible modifications and variations can be made without departing from the spirit and scope of the invention as hereinafter claimed.

What is claimed is:

1. A stacked package module, comprising:
a first package structure comprising a first circuit board with a first chip embedded therein, wherein the first chip has a plurality of first electrode pads, and the first circuit board comprises a core board, a first built-up structure corresponding to and disposed on one vertical side of the core board, and a plurality of exposed electro-connecting ends formed at one lateral side of the core board, therewith the first built-up structure comprising: at least one first dielectric layer; at least one first circuit layer, of which the outmost first circuit layer has a plurality of first conductive pads, on the at least one first dielectric layer; and a plurality of first conductive vias in the at least one first dielectric layer to conduct the at least one first circuit layer, and the first electrode pads of the first chip electrically connecting to the electro-connecting ends and the first conductive pads directly through the first conductive vias and the first circuit layer; and
a second package structure comprising a second circuit board and a second chip embedded in or disposed above the second circuit board, wherein the second circuit board has a first surface, an opposite second surface, and a plurality of second conductive pads on the second surface, therewith the second conductive pads of the second package structure electrically connecting to the first conductive pads of the first package structure through a plurality of first solder balls.

2. The stacked package module as claimed in claim 1, wherein the first conductive pads in the first package structure are arranged in a ball grid array.

3. The stacked package module as claimed in claim 1, wherein the core board of the first circuit board in the first package structure has a through cavity therein, therewith the first chip embedded in the cavity of the core board of the first circuit board, some of the first conductive vias in the first built-up structure electrically connecting to the first electrode pads of the first chip, a gap between the core board and the first chip filled with a filling material to fix the first chip, the first chip having an active surface with the first electrode pads thereon and an opposite inactive surface, and the electro-connecting ends extending from the core board, and the first circuit board further comprises a second built-up structure corresponding to and disposed on the other vertical side of the core board, therewith the second built-up structure comprising: at least one second dielectric layer, at least one second circuit layer on the at least one second dielectric layer; and a plurality of second conductive vias, in the at least one second dielectric layer.

4. The stacked package module as claimed in claim 3, wherein the first built-up structure in the first package structure further comprises a first solder mask having a plurality of first openings to expose the first conductive pads of the first built-up structure, and the second built-up structure in the first package structure further comprises a second molder mask, therewith the outmost second circuit layer of the second built-up structure having a plurality of second conductive pads, and the second solder mask having a plurality of second openings to expose the second conductive pads of the second built-up structure.

5. The stacked package module as claimed in claim 3, wherein the material of the filling material is selected from the group consisting of organic dielectric material, liquid organic resin, and prepreg.

6. The stacked package module as claimed in claim 4, further comprising at least one passive component electrically connecting to the second conductive pads of the first package structure by a plurality of second solder balls.

7. The stacked package module as claimed in claim 1, wherein the second circuit board in the second package structure has a core board with a through cavity therein, therewith the second chip embedded in the cavity of the core board, a gap between the core board and the second chip filled with a filling material to fix the second chip, and the second chip having an active surface with a plurality of second electrode pads thereon and an opposite inactive surface, and the second circuit board further has a first built-up structure and a second built-up structure corresponding to and disposed on two sides of the core board, respectively, therewith the second conductive pads disposed on a surface of the second built-up structure in the second package structure, the first built-up structure as well as the second built-up structure in the second package structure comprising at least one dielectric layer, at least one circuit layer on the at least one dielectric layer, a plurality of conductive vias in the at least one dielectric layer, and a solder mask having a plurality of openings to expose the second conductive pads in the second package structure, and some of the conductive vias in the second package structure electrically connecting to the second electrode pads of the second chip.

8. The stacked package module as claimed in claim 7, wherein the first built-up structure of the second package structure further comprises a plurality of first conductive pads, and the solder mask of the first built-up structure of the second package structure has a plurality of openings to expose the first conductive pads of the second package structure.

9. The stacked package module as claimed in claim 8, further comprising at least one passive component electrically connecting to the first conductive pads of the second package structure by a plurality of third solder balls.

10. The stacked package module as claimed in claim 1, wherein the second package structure is a flip chip package structure.

11. The stacked package module as claimed in claim 1, wherein the second package structure is a wire bonding package structure.

12. The stacked package module as claimed in claim 1, wherein the second circuit board has a through cavity therein, therewith the second chip embedded in the cavity of the second circuit board, a gap between the cavity of the second circuit board and the second chip filled with a filling material to fix the second chip, the second chip having an active surface and an opposite inactive surface, and the active surface having a plurality of second electrode pads and being at the same side with the first surface of the second circuit board, and the first surface of the second circuit board further has a plurality of wire bonding pads, therewith the second electrode pads of the second chip electrically connecting to the wire bonding pads through a plurality of metal wires, and a molding material wrapping the metal wires, the second electrode pads of the second chip and the wire bonding pads of the second circuit board.

13. The stacked package module as claimed in claim 12, wherein the material of the filling material is selected from the group consisting of organic dielectric material, liquid organic resin, and prepreg.

14. The stacked package module as claimed in claim 1, wherein the materials of the conductive pads are individually selected from the group consisting of copper, silver, gold, nickel/gold, nickel/palladium/gold, and the combination thereof.

15. The stacked package module as claimed in claim 1, wherein the surfaces of the electro-connecting ends further have a passivation layer thereon.

16. The stacked package module as claimed in claim 15, wherein the passivation layer is a gold layer.

* * * * *